Jan. 7, 1964 J. I. RHODES 3,117,281

TUNNEL DIODE OSCILLATOR AND CONVERTER CIRCUITS

Filed May 17, 1960

Junior I. Rhodes
*INVENTOR.*

BY Isidore Match

ATTORNEY

United States Patent Office 3,117,281
Patented Jan. 7, 1964

3,117,281

TUNNEL DIODE OSCILLATOR AND CONVERTER CIRCUITS

Junior I. Rhodes, Lynchburg, Va., assignor to General Electric Company, a corporation of New York Filed May 17, 1960, Ser. No. 29,607
5 Claims. (Cl. 325—449)

This invention relates to oscillator circuits. More particularly, it relates to oscillator circuits comprising semiconductor devices exhibiting negative resistance properties.

The recently discovered tunnel diode, so called, is a PN semiconductor device which takes its name from the physical phenomenon that makes it possible, i.e., "quantum mechanical tunneling." The latter term is used to describe the manner in which the electrical charges move through the device and signifies the direct transfer of energy through the PN junction.

In known semiconductor crystals which are of high quality, the PN junction can be considered as a wide barrier to the direct transfer of energy thereacross. As the crystals are made less and less perfect, the barrier is increasingly narrowed. If the barrier is sufficiently narrow, an electrical charge under the quantum mechanical tunneling concept may simultaneously occupy positions in both the P and N regions of the crystal. Stating this in another manner, an electrical charge under this concept may be said to pass through the barrier with speed of light. The electrical charge may then be described as having tunneled through the barrier.

In contrast with a conductor wherein an increase in voltage results in an increase in current, in the tunnel diode, within a given range of voltage, an increase in voltage results in a decrease of current, i.e., the tunnel diode has a negative resistance characteristic within such voltage range. It is believed that this negative resistance characteristic results from the instantaneous passage of the charges across the barrier.

Accordingly, in order for a semiconductor diode to operate as a tunnel diode, it has to be sufficiently doped with P and N type significant impurities on either side of the PN barrier respectively to make the crystal "degenerate." By a degenerate semiconductor is meant a semiconductor body to which there has been added sufficient donor impurity so that the Fermi level is higher in energy than the conduction band edge and/or to which there has been added sufficient acceptor impurity so that the Fermi level has been depressed to an energy value lower than the energy value of the valence band edge.

A semiconductor diode device exhibiting the quantum mechanical tunneling phenomenon may be approximately defined as a junction diode having a barrier width of no more than 200 Angstrom units and donor and acceptor impurity concentrations in excess of $10^{18}$ atoms per cubic centimeter on either side of the PN junction. The junction may be formed by known alloying techniques. Diodes prepared in this manner exhibit the aforedescribed negative resistance characteristic at low forward voltages. For example, the range of the negative resistance characteristic is from about 0.04 to 0.3 volt for a germanium device; about 0.08 to 0.4 volt for a silicon device; and about 0.03 to 0.3 volt for a gallium antimonide device.

Since the tunnel diode has this negative resistance characteristic at low forward voltage, it can operate as an amplifier and perform many other functions. Instead of absorbing a signal as a resistor does, it increases it. A tunnel diode is also quite a bit smaller than a transistor. Because of its negative resistance characteristic and its advantageous smallness of size, it lends itself to use as a generator in a miniaturized oscillator circuit. Also, because the electrical charges travel across the PN barrier with the speed of light, the tunnel diode has a very high-speed response which enables it to operate at extremely high frequencies.

It is, accordingly, an important object of this invention to provide an oscillator circuit wherein a tunnel diode is utilized as the active device.

It is a further object of the invention to provide an oscillator circuit in accordance with the preceding object which is crystal controlled.

It is still another object of the invention to provide a combined crystal controlled oscillator and mixer with an output intermediate radio frequency wherein a tunnel diode is employed as the sole active device to supply the necessary negative resistance as well as non-linearity for efficient mixing.

Generally speaking and in accordance with the invention, there is provided a crystal controlled oscillator circuit which comprises as the active element therein, a narrow junction semiconductor diode having a negative resistance characteristic at low forward biasing voltages. The diode is biased for operation in the region of its negative voltage characteristic. Connected in shunt with the diode is a piezoelectric crystal and also connected in shunt with the diode is an impedance element, or a plurality of impedance elements. The value of the impedance is chosen such that the oscillator oscillates at a fundamental or mode frequency of the resultant of the antiresonant impedance of the crystal and the value of the impedance element or elements. In this manner, the oscillator frequency may be shifted a finite amount depending upon the values of reactive elements connected across the crystal.

The features of this invention which are believed to be new are set forth with particularity in the appended claims. The invention, itself, may best be understood by reference to the following description when taken in conjunction with the accompanying drawing which discloses embodiments of a circuit according to the invention.

In the drawing—

Figure 4:
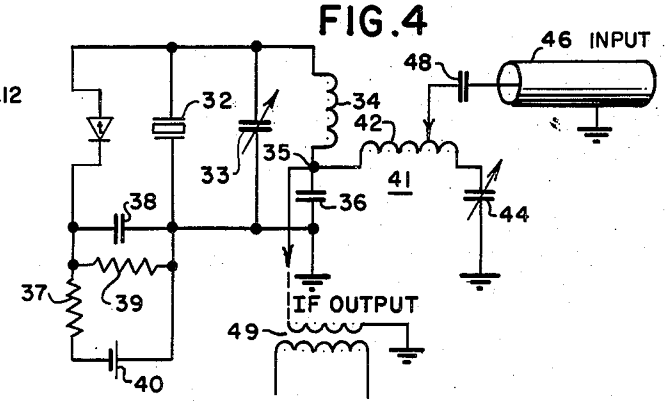
Figure 5:
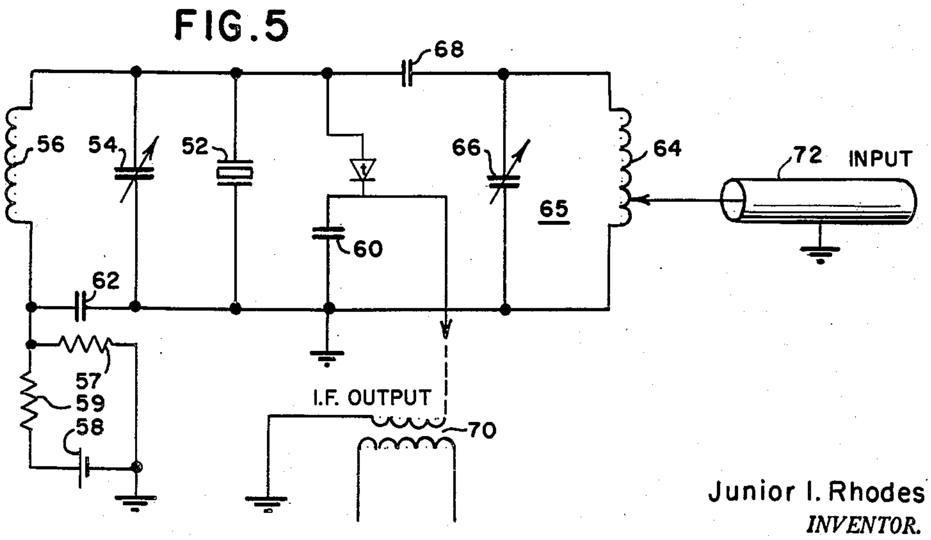

FIG. 4 is an embodiment of a mixer circuit in accordance with the invention wherein the voltage to be mixed with the output of the oscillator is applied to a low impedance side of the oscillator circuit; and FIG. 5 is an embodiment of a mixer circuit in accordance with the invention wherein the oscillator is shown as having a high impedance side and wherein the voltage mixed with the voltage output of the oscillator is applied to this high impedance side.

Figure 1:
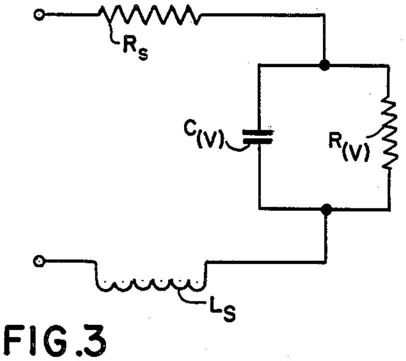
FIG. 1 is an equivalent circuit for the tunnel diode when it is operated in the region of its negative resistance characteristic.

Referring now to FIG. 1, it is seen that the equivalent circuit for the tunnel diode in its negative resistance characteristic region comprises a series connected resistance $R_s$, a series connected inductance $L_s$, and a series connected parallel combination comprising a capacitance $C(v)$ and a negative resistance $-R(v)$. It is the latter negative resistance which enables the tunnel diode to function as the active element or generator in the oscillator circuit. Of course, it is required that the impedance presented to the tunnel diode exceed the value of the negative resistance, the latter being determined by the particular narrow junction semiconductor that is used.

Figure 2:
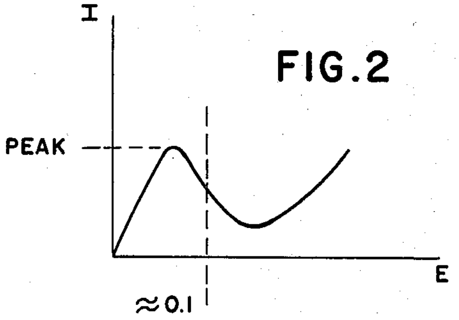
FIG. 2 is a curve of the voltage current characteristic of the diode.

In the curve of FIG. 2, the abscissa is forward biasing voltage applied to the diode and the ordinate is current flowing therethrough. In this figure, the diode is chosen to be of the germanium type and thus the region of its negative resistance characteristic extends from about 0.04 to 0.3 volt. The horizontal dashed line indicates peak current and the vertical dashed line indicates a suitable operating point such as approximately 0.1 volt.

Figure 3:
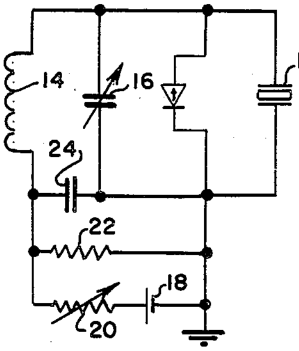
FIG. 3 is an embodiment of an oscillator circuit in accordance with the invention.

Referring now to FIG. 3 wherein there is shown an oscillator circuit in accordance with the invention, a tunnel diode 10 is connected in parallel arrangement with a piezoelectric crystal 12 and a tunable antiresonant circuit comprising an inductor 14 and a variable capacitor 16. For providing the biasing potentials to diode 10 whereby it operates at a chosen operating point in its negative resistance characteristic region, there is included a source of unidirectional potential 18 having a negative terminal which is grounded. The anode of diode 10 is connected to the positive terminal of source 18 through inductor 14 and a variable resistor 20. Shunting the series arrangement of resistor 20 and source 18 is a resistor 22. The cathode of diode 10 is grounded and a capacitor 24 is included in circuit between inductor 14 and ground.

In operation, the circuit of FIG. 3 oscillates at the frequency of the maximum parallel impedance provided by the resultant of the antiresonant impedance of piezoelectric crystal 10 and the impedance of parallel resonant circuit 16, which comprises inductor 14 and variable capacitor 16. This can be understood if it is recognized that a piezoelectric crystal has a parallel impedance, i.e., an antiresonant impedance $Zp$ at a mode of oscillation and a series resonant impedance $Zs$. For example, the following are the impedance properties of an AT cut quartz crystal having a fundamental mode of operation at 16.23.

(*a*) Third mode, 48.7 mc., $Zp$ 11,000 ohms, $Zs$, 15 ohms.
(*b*) Fifth mode, approximately 81 mc., $Zp$ 1500 ohms, $Zs$, 37 ohms.
(*c*) Seventh mode, approximately 113 mc., $Zp$, 500 ohms, $Zs$, 100 ohms.

Thus the parallel resonant circuit comprising inductor 14 and capacitor 16 can be utilized to choose the frequency mode at which the oscillator of FIG. 3 oscillates by varying the capacitance of capacitor 16, thereby selecting an oscillating mode with the parallel resonant circuit.

For the operation of the crystal at its fundamental antiresonant frequency of 16.23 mc., the parallel resonant circuit comprising inductor 14 and capacitor 16 may be replaced by an inductor having a reactance high enough at the operating frequency so as not to shunt excessively the crystal impedance.

In the circuit at FIG. 3, diode 10 may be operated with a forward biasing voltage of 0.1 volt. In such situation, it presents a 200 ohms negative slope. As seen in the tabulation of the crystal impedances, all of the $Zp$'s exceed such 200 ohm value whereby the circuit oscillates. Capacitor 24 is provided so that inductor 14 is at A.C. ground.

In FIG. 4 wherein there is shown a mixer circuit in accordance with the invention a tunnel diode 30 is connected in shunt with a piezoelectric crystal 32 and a parallel resonant circuit for selecting the frequency of operation of the circuit comprising a variable capacitor 33 and an inductor 34. Inductor 34 is coupled to inductor 42 through a mutual capacitor 36. The cathode of tunnel diode 30 is at A.C. ground due to the presence of capacitor 38. As is shown, diode 30 is forward biased from unidirectional potential source 40, the positive terminal of source 40 being at ground, the cathode of diode 30 being connected to the negative terminal of source 40 through a resistor 37. Shunting source 40 and resistor 37 is a resistor 39. The mixing or input voltage is applied to a resonant circuit 41 comprising inductor 42 and a variable capacitor 44 through a capacitor 48, the mixed voltage output resulting at the junction point 35 of inducors 34 and 42 respectively. Capacitor 48 presents a relatively low reactance at input signal frequencies and a high reactance at intermediate radio frequencies. The mixing voltage may be furnished to the resonant circuit 41 from an input antenna 46 or other like source. In the circuit of FIG. 4, the intermediate radio frequency output is developed across capacitor 36. Since the signal input voltage is applied at the junction point 35, the coupling in this circuit may be described as low impedance side coupling, the value of capacitor 48, as has been stated being chosen to provide a relatively low impedance to input frequency voltages. The output at junction point 35 is the difference between the signal input voltage and the oscillator voltage. The output of the circuit of FIG. 4 may be developed across a transformer 49.

In the circuit of FIG. 5, shunting a tunnel diode 50 on one side of the circuit is a piezoelectric crystal 52 and a parallel resonant circuit comprising a variable capacitor 54 and an inductor 56. A voltage within its range of negative resistance characteristic is applied to the anode of diode 50 from a undirectional source 58. The negative terminal of source 58 being grounded, the anode of diode 50 being connected to the positive terminal of source 58 through a resistor 59, and inductor 56. A resistor 57 is provided in shunt with resistor 59 and source 58. The cathode of diode 50 is grounded through a capacitor 60 and the junction of resistor 59 and source 58 is grounded through a capacitor 62. The signal input voltage is applied from an input device 72 to diode 50 through a circuit 65 comprising in parallel arrangement, an inductor 64 and a variable capacitor 66 and a series connected coupling capacitor 68. The intermediate radio frequency output of the circuit is taken from the junction of the cathode of tunnel diode 50 and capacitor 60.

Since the input voltage is coupled to a point on inductor 64 and since inductor 64 presents a relatively high impedance to the flow of radio frequency current, the coupling of the mixing voltage to the oscillator circuit shown in FIG. 5 may be described as high impedance side coupling. Of course, since the output intermediate radio frequency is developed across capacitor 60, which is chosen to present a relatively low impedance to the flow of radio frequency current, the output of the circuit is low impedance similar to the circuit of FIG. 4. The output of the circuit may be developed across a transformer 70.

While there have been described what are considered to be the preferred embodiments of this invention, it will be obvious to those skilled in the art that various changes and modifications may be made therein without departing from the invention and it is, therefore, aimed in the appended claims to cover all such changes and modifications as fall within the spirit and scope of the invention.

What is claimed and desired to be secured by Letters Patent of the United States is:

1. A crystal controlled oscillator comprising a narrow junction semiconductor diode having a negative resistance characteristic at low forward biasing voltages, means for biasing said diode for operation in its negative resistance characteristic region, a piezoelectric crystal in parallel relationship with said diode, and a network comprising a parallel combination of an inductance and a capacitance connected in parallel arrangement with said crystal and said diode for determining the mode of operation of said crystal and the oscillator frequency, the parallel resonant frequency of said network being so chosen that the resultant impedance due to the crystal and network is greater than the negative impedance of said diode and equal to that impedance necessary to operate at the desired crystal mode.

2. A mixer circuit comprising a narrow junction semiconductor diode having a negative resistance characteristic at low forward biasing voltages, means for biasing said diode for operation in its negative resistance characteristic region, a piezoelectric crystal in parallel relationship with said diode, a network comprising a parallel combination of an inductance and a capacitance connected in parallel arrangement with said diode and said crystal for determining the mode of operation of said crystal the parallel resonant frequency of said network being so chosen that the resultant impedance due to said crystal and network is greater than the negative impedance of said diode and is substantially equal to the impedance necessary to operate at the desired crystal mode a source of AC voltage and means for mixing voltage from said source with the voltage provided by said oscillations.

3. A mixer circuit as defined in claim 2 and further including a second capacitance in series arrangement with said inductance, said mixed output voltage being provided at the junction of said inductance and said second capacitance.

4. A circuit comprising a narrow junction semiconductor diode having a negative resistance characteristic at low forward biasing voltages, means for biasing said diode for operation in its negative resistance characteristic region, a piezoelectric crystal in parallel relationship with said diode. first and second networks each including individual inductances and capacitances connected in parallel arrangement with said diode for determining the mode of operation of said crystal the parallel resonant frequencies of said networks being so chosen that the resultant impedance due to said networks and said crystal is greater than the negative impedance of said diode and equal to the impedance necessary to operate at the desired crystal mode source of AC voltage, means for applying voltage from said source to said circuit to provide a resulting mixed voltage and means for developing said mixed voltage across said third capacitance.

5. A circuit as defined in claim 4 wherein said source voltage is applied to one of said inductances.

References Cited in the file of this patent

UNITED STATES PATENTS

| | | |
|---|---|---|
| 2,043,242 | Gebhard | June 9, 1936 |
| 2,332,102 | Mason | Oct. 19, 1943 |
| 2,469,569 | Ohl | May 10, 1949 |
| 2,770,731 | Bopp et al. | Nov. 13, 1956 |

FOREIGN PATENTS

| | | |
|---|---|---|
| 158,879 | Australia | Sept. 16, 1954 |

OTHER REFERENCES

Somers: Proc. IRE, July 1959, p. 1206.

Lesk et al.: "Germanium and Silicon Tunnel Diodes . . . ," IRE Wescon Convention Record, Part 3, August 1959.

Pub. I, Electronic Engineering, April 1960, p. 245.